(12) United States Patent
Gotoda et al.

(10) Patent No.: US 8,890,194 B2
(45) Date of Patent: Nov. 18, 2014

(54) SEMICONDUCTOR LIGHT EMITTING DEVICE

(71) Applicants: Toru Gotoda, Kanagawa-ken (JP); Shinji Yamada, Kanagawa-ken (JP); Shinya Nunoue, Chiba-ken (JP)

(72) Inventors: Toru Gotoda, Kanagawa-ken (JP); Shinji Yamada, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 58 days.

(21) Appl. No.: 13/729,457

(22) Filed: Dec. 28, 2012

(65) Prior Publication Data
US 2014/0048816 A1 Feb. 20, 2014

(30) Foreign Application Priority Data
Aug. 14, 2012 (JP) ................................. 2012-179800

(51) Int. Cl.
- *H01L 33/22* (2010.01)
- *H01L 33/00* (2010.01)
- *H01L 33/64* (2010.01)
- *H01L 33/40* (2010.01)
- *H01L 33/32* (2010.01)

(52) U.S. Cl.
CPC .............. *H01L 33/32* (2013.01); *H01L 33/641* (2013.01); *H01L 33/0079* (2013.01); *H01L 33/40* (2013.01)
USPC ...................................... 257/98; 257/E33.06

(58) Field of Classification Search
USPC .......................... 257/76, 98, E33.06; 3/76, 98
See application file for complete search history.

(56) References Cited

U.S. PATENT DOCUMENTS

| | | | | |
|---|---|---|---|---|
| 7,800,124 B2* | 9/2010 | Urano et al. | ..................... | 257/98 |
| 7,824,937 B2* | 11/2010 | Suehiro et al. | .................. | 438/26 |
| 7,863,639 B2* | 1/2011 | Yen | ................................. | 257/99 |
| 7,955,959 B2* | 6/2011 | Wu et al. | ....................... | 438/494 |
| 8,008,678 B2* | 8/2011 | Tran et al. | ........................ | 257/98 |
| 8,013,320 B2* | 9/2011 | Matsuo et al. | ................... | 257/13 |
| 8,044,424 B2* | 10/2011 | Urano et al. | ..................... | 257/98 |
| 8,067,780 B2* | 11/2011 | Shieh et al. | ..................... | 257/99 |

(Continued)

FOREIGN PATENT DOCUMENTS

| | | |
|---|---|---|
| EP | 2 317 562 A1 | 5/2011 |
| JP | 2007-142479 | 6/2007 |

(Continued)

OTHER PUBLICATIONS

U.S. Appl. No. 14/175,107, filed Feb. 7, 2014, Yamada, et al.

(Continued)

*Primary Examiner* — Earl Taylor
(74) *Attorney, Agent, or Firm* — Oblon, Spivak, McClelland, Maier & Neustadt, L.L.P.

(57) ABSTRACT

According to one embodiment, a semiconductor light emitting device includes a metal substrate, a first semiconductor layer, a first semiconductor layer, a second semiconductor layer, a light emitting layer, a first intermediate layer and a second intermediate layer. The substrate has a coefficient of thermal expansion not more than $10 \times 10^{-6}$ m/K. The first and second semiconductor layer include a nitride semiconductor. The second semiconductor layer is provided between the substrate and the first semiconductor layer. The emitting layer is provided between the first semiconductor layer and the second semiconductor layer. The first intermediate layer is provided between the substrate and the second semiconductor layer. The second intermediate layer is provided between the first intermediate layer and the second semiconductor layer. a surface roughness of a first surface of the substrate contacting the first intermediate layer is less than a thickness of the first intermediate layer.

20 Claims, 8 Drawing Sheets

(56) References Cited

U.S. PATENT DOCUMENTS

| | | | |
|---|---|---|---|
| 8,101,498 B2* | 1/2012 | Pinnington et al. | 438/455 |
| 8,101,966 B2* | 1/2012 | Yen | 257/99 |
| 8,134,174 B2* | 3/2012 | Yu et al. | 257/99 |
| 8,143,140 B2* | 3/2012 | Kasai et al. | 438/458 |
| 8,148,890 B2* | 4/2012 | Abe et al. | 313/502 |
| 8,153,507 B2* | 4/2012 | Ma | 438/458 |
| 8,154,047 B2* | 4/2012 | Suehiro et al. | 257/100 |
| 8,193,634 B2* | 6/2012 | Wong et al. | 257/717 |
| 8,198,113 B2* | 6/2012 | Nihei et al. | 438/46 |
| 8,320,419 B2* | 11/2012 | Krejci et al. | 372/34 |
| 8,373,195 B2* | 2/2013 | Yen | 257/99 |
| 8,552,451 B2* | 10/2013 | Tran et al. | 257/98 |
| 8,564,006 B2* | 10/2013 | Tachibana et al. | 257/98 |
| 8,598,605 B2* | 12/2013 | Sugiyama et al. | 257/94 |
| 8,680,566 B2* | 3/2014 | Muramoto et al. | 257/99 |
| 8,685,766 B2* | 4/2014 | Suehiro et al. | 438/26 |
| 2006/0118808 A1 | 6/2006 | Ishidu et al. | |
| 2006/0154392 A1* | 7/2006 | Tran et al. | 438/22 |
| 2006/0255341 A1* | 11/2006 | Pinnington et al. | 257/79 |
| 2009/0014743 A1* | 1/2009 | Tran et al. | 257/98 |
| 2009/0104727 A1* | 4/2009 | Krejci et al. | 438/46 |
| 2010/0055819 A1* | 3/2010 | Ohba et al. | 438/47 |
| 2011/0039356 A1* | 2/2011 | Ando et al. | 438/16 |
| 2011/0051758 A1* | 3/2011 | Krejci et al. | 372/34 |
| 2011/0076791 A1* | 3/2011 | Wu et al. | 438/31 |
| 2011/0127567 A1* | 6/2011 | Seong | 257/99 |
| 2011/0215292 A1* | 9/2011 | Zaima et al. | 257/13 |
| 2011/0215293 A1* | 9/2011 | Zaima et al. | 257/13 |
| 2011/0220911 A1* | 9/2011 | Katsuno et al. | 257/76 |
| 2011/0220932 A1* | 9/2011 | Katsuno et al. | 257/98 |
| 2011/0220933 A1* | 9/2011 | Gotoda et al. | 257/98 |
| 2011/0220934 A1* | 9/2011 | Gotoda et al. | 257/98 |
| 2011/0220935 A1* | 9/2011 | Gotoda et al. | 257/98 |
| 2011/0227033 A1* | 9/2011 | Kushibe et al. | 257/13 |
| 2011/0241045 A1* | 10/2011 | Ye et al. | 257/98 |
| 2011/0241050 A1* | 10/2011 | Ye et al. | 257/98 |
| 2011/0284867 A1* | 11/2011 | Tran et al. | 257/76 |
| 2011/0297993 A1* | 12/2011 | Cho et al. | 257/98 |
| 2011/0303895 A1* | 12/2011 | Lin et al. | 257/13 |
| 2012/0001152 A1* | 1/2012 | Kim et al. | 257/13 |
| 2012/0040480 A1* | 2/2012 | Shieh et al. | 438/26 |
| 2012/0056154 A1* | 3/2012 | Zaima et al. | 257/13 |
| 2012/0070958 A1 | 3/2012 | Furukawa et al. | |
| 2012/0086035 A1* | 4/2012 | Yen | 257/98 |
| 2012/0095584 A1* | 4/2012 | Ando et al. | 700/108 |
| 2012/0098014 A1* | 4/2012 | Muramoto | 257/98 |
| 2012/0119184 A1* | 5/2012 | Hsu et al. | 257/13 |
| 2012/0199811 A1* | 8/2012 | Zaima et al. | 257/13 |
| 2012/0217531 A1* | 8/2012 | Katsuno et al. | 257/99 |
| 2012/0220063 A1* | 8/2012 | Seong | 438/46 |
| 2012/0235168 A1* | 9/2012 | Katsuno et al. | 257/88 |
| 2012/0260983 A1 | 10/2012 | Pruneri et al. | |
| 2012/0292631 A1 | 11/2012 | Katsuno et al. | |
| 2012/0298952 A1* | 11/2012 | Hikosaka et al. | 257/13 |
| 2012/0299015 A1* | 11/2012 | Tachibana et al. | 257/79 |
| 2012/0319161 A1* | 12/2012 | Gotoda et al. | 257/103 |
| 2013/0001782 A1* | 1/2013 | Otsuka et al. | 257/751 |
| 2013/0069032 A1* | 3/2013 | Kushibe et al. | 257/13 |
| 2013/0069033 A1* | 3/2013 | Kushibe et al. | 257/13 |
| 2013/0087760 A1* | 4/2013 | Yoshida et al. | 257/13 |
| 2013/0087761 A1* | 4/2013 | Kimura et al. | 257/13 |
| 2013/0087806 A1* | 4/2013 | Ito et al. | 257/76 |
| 2013/0092898 A1* | 4/2013 | Muramoto et al. | 257/13 |
| 2013/0126937 A1* | 5/2013 | Muramoto et al. | 257/99 |
| 2013/0153922 A1* | 6/2013 | Gotoda et al. | 257/76 |
| 2013/0234106 A1* | 9/2013 | Sugiyama et al. | 257/13 |
| 2013/0234182 A1* | 9/2013 | Katsuno et al. | 257/98 |
| 2013/0244360 A1* | 9/2013 | Sato et al. | 438/29 |
| 2013/0328055 A1* | 12/2013 | Tajima et al. | 257/76 |
| 2013/0328075 A1* | 12/2013 | Tajima et al. | 257/94 |
| 2014/0048816 A1* | 2/2014 | Gotoda et al. | 257/76 |

FOREIGN PATENT DOCUMENTS

| | | |
|---|---|---|
| JP | 2010-192701 A | 9/2010 |
| JP | 2012-19137 A | 1/2012 |
| JP | 2012-89828 A | 5/2012 |
| JP | 4989773 B1 | 8/2012 |
| WO | WO 2004/082034 A1 | 9/2004 |

OTHER PUBLICATIONS

Office Action issued on Aug. 5, 2014 in corresponding Japanese Patent Application No. 2012-179800 (with English translation).

* cited by examiner

US 8,890,194 B2

SEMICONDUCTOR LIGHT EMITTING DEVICE

CROSS-REFERENCE TO RELATED APPLICATION

This application is based upon and claims the benefit of priority from the prior Japanese Patent Application No. 2012-179800, filed on Aug. 14, 2012; the entire contents of which are incorporated herein by reference.

FIELD

Embodiments described herein relate generally to a semiconductor light emitting device.

BACKGROUND

One method for manufacturing a semiconductor light emitting device includes bonding a substrate that has excellent heat dissipation to a growth substrate on which a stacked body including a nitride semiconductor is provided, and subsequently removing the growth substrate. It is desirable to increase the reliability of the semiconductor light emitting device.

DETAILED DESCRIPTION

Figure 1:
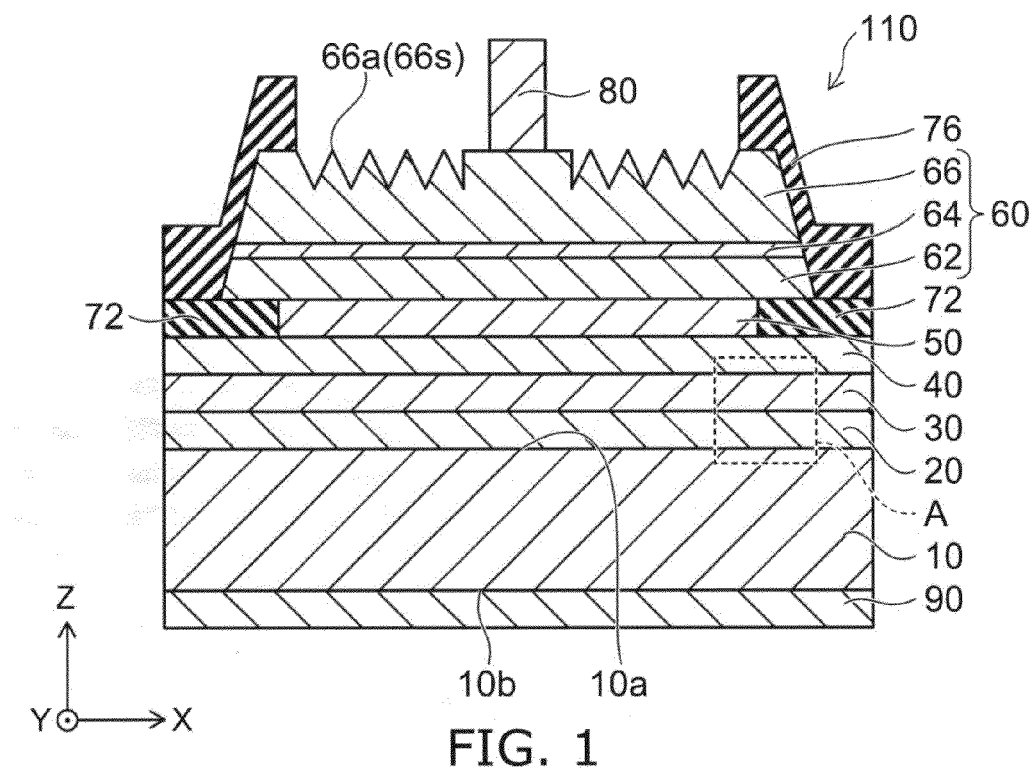
FIG. 1 is a schematic view showing a semiconductor light emitting device according to a first embodiment.

In general, according to one embodiment, a semiconductor light emitting device includes a metal substrate, a first semiconductor layer, a first semiconductor layer of a first conductivity type, a second semiconductor layer of a second conductivity type, a light emitting layer, a first intermediate layer and a second intermediate layer. The metal substrate has a coefficient of thermal expansion not more than $10\times10^{-6}$ m/K. The first semiconductor includes a nitride semiconductor. The second semiconductor layer is provided between the metal substrate and the first semiconductor layer. The second semiconductor layer includes a nitride semiconductor. The light emitting layer is provided between the first semiconductor layer and the second semiconductor layer. The light emitting layer includes a nitride semiconductor. The first intermediate layer is provided between the metal substrate and the second semiconductor layer to contact the metal substrate. The second intermediate layer is provided between the first intermediate layer and the second semiconductor layer. a surface roughness of a first surface of the metal substrate contacting the first intermediate layer is less than a thickness of the first intermediate layer.

Embodiments of the invention will now be described with reference to the drawings.

The drawings are schematic or conceptual; and the relationships between the thicknesses and the widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1 is a schematic view showing a semiconductor light emitting device according to a first embodiment.

Figure 2:
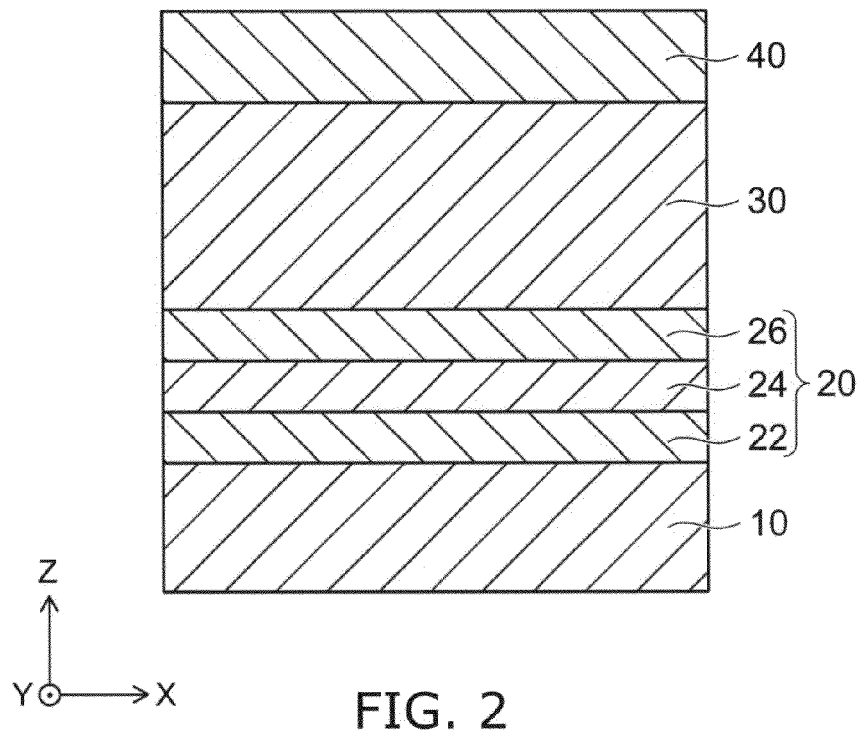
FIG. 2 is a cross-sectional view in which portion A of FIG. 1 is enlarged.

FIG. 2 is a cross-sectional view in which portion A of FIG. 1 is enlarged.

The semiconductor light emitting device 110 of the embodiment includes a metal substrate 10, a stacked body 60, a first intermediate layer 20, and a second intermediate layer 30. The stacked body 60 includes a first semiconductor layer 66, a light emitting layer 64, and a second semiconductor layer 62.

The semiconductor light emitting device 110 is formed by bonding between the stacked body 60 and the metal substrate (hereinbelow, called substrate bonding). A growth substrate 18 used to form the stacked body 60 is removed.

The metal substrate 10 supports the stacked body 60. The metal substrate 10 has a first surface 10a, and a second surface 10b on the side opposite to the first surface 10a. The first surface 10a is the surface that contacts the first intermediate layer 20 described below.

Herein, an axis perpendicular to the first surface 10a of the metal substrate 10 is taken as a Z axis. One axis perpendicular to the Z axis is taken as an X-axis direction. A direction perpendicular to the Z axis and the X axis is taken as a Y axis. Hereinbelow, "stacking" includes not only the case of being overlaid in contact with each other but also the case of being overlaid with another layer inserted therebetween. Further, being "provided on" includes not only the case of being provided in direct contact but also the case of being provided with another layer inserted therebetween.

It is favorable for the coefficient of thermal expansion of the metal substrate 10 to be near the coefficient of thermal expansion of the growth substrate 18. The growth substrate 18 is, for example, one selected from a silicon (Si) substrate, a sapphire substrate, and a silicon carbide (SiC) substrate. The coefficient of thermal expansion of the Si substrate is $2.5\times10^{-6}$ m/K. The coefficient of thermal expansion of the sapphire substrate is $5.2\times10^{-6}$ m/K. The coefficient of thermal expansion of the SiC substrate is $3.7\times10^{-6}$ m/K. For example, the coefficient of thermal expansion of the metal substrate 10 is not more than $10\times10^{-6}$ m/K. Thereby, peeling in the substrate bonding is suppressed.

The thermal conductivity of the metal substrate 10 is higher than the thermal conductivity of the growth substrate 18. For example, the thermal conductivity of the metal substrate 10 is not less than 160 W/m·K. Thereby, the heat from the stacked body 60 is emitted.

The metal substrate 10 includes, for example, a sintered impregnated metal. The metal substrate 10 includes a first metal portion including a first metal, and a second metal portion including a second metal dispersed in the first metal portion. The first metal portion is formed by sintering a powder of the first metal. The second metal portion is formed by causing the first metal portion to be impregnated with the second metal. An elution prevention agent of the second metal may be used in the impregnation. By using the sintered impregnated metal as the metal substrate 10, the adhesion with the first intermediate layer 20 described below is better.

For example, one selected from the first metal portion and the second metal portion includes one selected from molybdenum (Mo) and tungsten (W); and the other selected from the first metal portion and the second metal portion includes copper (Cu).

Figure 3:
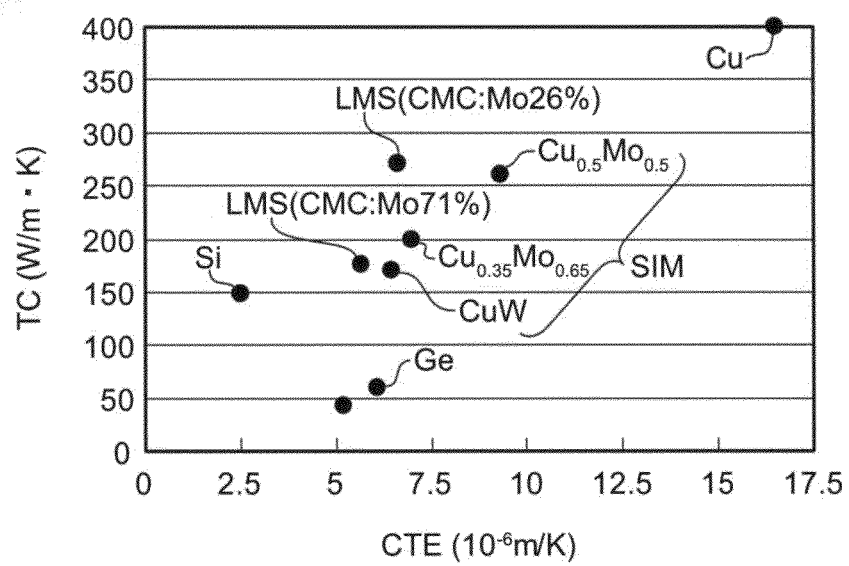
FIG. 3 is a graph showing the coefficient of thermal expansion and the thermal conductivity.

FIG. 3 is a graph showing the coefficient of thermal expansion and the thermal conductivity.

FIG. 3 shows the coefficient of thermal expansion (CTE: $10^{-6}$ m/K) and the thermal conductivity (TC: W/m·K) for various substrates.

FIG. 3 shows laminated metals (LM) and sintered impregnated metals (SIM). The laminated metals LM shown in FIG. 3 are metals in which Cu, Mo, and Cu are laminated and bonded by hot pressing. The proportion of Mo in the entirety is illustrated. $Cu_{0.5}Mo_{0.5}$, $Cu_{0.35}Mo_{0.65}$, and CuW are illustrated for the sintered impregnated metals SIM.

As shown in FIG. 3, the thermal conductivities of the laminated metals LM are higher than that of Si. However, as described below, there is a possibility that the lamination interface may peel in the substrate bonding.

Conversely, for the sintered impregnated metals SIM, the coefficient of thermal expansion CTE and the thermal conductivity TC change linearly with the composition ratio of Cu and Mo. The sintered metal does not peel at the interface with the contained metal. Accordingly, for example, it is favorable for the metal substrate 10 to include one selected from $Cu_{0.5}Mo_{0.5}$, $Cu_{0.35}Mo_{0.65}$, and CuW. In such a case, the coefficient of thermal expansion of the metal substrate 10 satisfies being not more than $10 \times 10^{-6}$ m/K. Also, the thermal conductivity of the metal substrate 10 satisfies being not less than 160 W/m·K by the metal substrate 10 including Cu. There is a tendency for the peeling of the metal to be suppressed even when the composition ratio of Mo in the metal substrate 10 is high.

The thickness of the metal substrate 10 is, for example, not more than 200 micrometers (μm). In the case where the thickness of the metal substrate 10 is thicker than 200 μm, there is a possibility that the growth substrate 18 and the stacked body 60 may peel due to the stress that occurs when cooling after the substrate bonding. On the other hand, when the thickness of the metal substrate 10 is not more than 200 μm, the peeling of the growth substrate 18 is suppressed.

Here, the first surface 10a of the metal substrate 10 is polished by, for example, CMP (Chemical Mechanical Polishing). The surface roughness of the first surface 10a of the metal substrate 10 is less than the thickness of the first intermediate layer 20 described below. In other words, the value of the surface roughness of the first surface 10a is less than the value of the roughness of the first intermediate layer 20. The first surface 10a is covered with the first intermediate layer 20 along the recesses and protrusions of the first surface 10a. Thereby, in the substrate bonding, diffusion of the metal (e.g., the Cu) included in the metal substrate 10 into the second intermediate layer 30 or diffusion of the metal (e.g., the Au and the Sn) included in the second intermediate layer 30 into the metal substrate 10 (the mutual diffusion of the metals) is suppressed.

The surface roughness of the metal substrate 10 is measured by, for example, AFM (Atomic Force Microscopy) or a surface roughness meter (Surfcorder). While "surface roughness" is not particularly limited, for example, "surface roughness" may be the arithmetic average surface roughness Ra specified by ES-B-0601.

The surface roughness of the first surface 10a of the metal substrate 10 is, for example, not more than 100 nm, and more favorably not more than 50 nm. The diffusion of the metal recited above is markedly suppressed by the surface roughness of the first surface 10a being not more than 50 nm.

The stacked body 60 is provided on the first surface 10a side of the metal substrate 10. As described above, the stacked body 60 includes the first semiconductor layer 66 of the first conductivity type, the light emitting layer 64, and the second semiconductor layer 62 of the second conductivity type.

The first conductivity type is, for example, an n type. The second conductivity type that is opposite to the first conductivity type is, for example, a p type. The first conductivity type may be the p type; and the second conductivity type may be the n type. The case where the first conductivity type is the n type and the second conductivity type is the p type is described as an example in the embodiment.

The first semiconductor layer 66 includes a nitride semiconductor. The conductivity type of the first semiconductor layer 66 is, for example, the n type. The first semiconductor layer 66 includes, for example, silicon (Si) as a dopant. The Si concentration of the first semiconductor layer 66 is not less than $1 \times 10^{18}$ cm$^{-3}$. Thereby, the current spread length of the first semiconductor layer 66 lengthens; and the luminous efficiency increases.

The first semiconductor layer 66 includes a third surface 66a on the side opposite to the metal substrate 10. The third surface 66a is the surface from which the light emitted from the light emitting layer 64 is mainly emitted to the outside.

The third surface 66a of the first semiconductor layer 66 includes multiple recess/protrusion portions 66s. The length between the adjacent protrusions of the recess/protrusion portions 66s is longer than the peak wavelength inside the first semiconductor layer 66 of the emitted light that is radiated from the light emitting layer 64. Thereby, the light extraction efficiency increases.

The second semiconductor layer 62 is provided between the metal substrate 10 and the first semiconductor layer 66. The second semiconductor layer 62 includes a nitride semiconductor. The conductivity type of the second semiconductor layer 62 is, for example, the p type. The second semiconductor layer 62 includes, for example, magnesium (Mg) as a dopant. It is favorable for the concentration of Mg in the second semiconductor layer 62 to be, for example, $1 \times 10^{21}$ cm$^{-3}$. Thereby, the second semiconductor layer 62 has an ohmic contact to a second electrode 50.

Because the resistivity of the p-type nitride semiconductor is high, it is desirable for the thickness of the second semiconductor layer 62 to be not more than 100 nm. For example, the second semiconductor layer 62 includes an 80 nm GaN layer that contacts the light emitting layer 64, and a 5 nm GaN layer that contacts the second electrode 50.

The light emitting layer 64 is provided between the first semiconductor layer 66 and the second semiconductor layer 62. The light emitting layer 64 includes a nitride semiconductor. The light emitting layer 64 includes, for example, $Al_xGa_yIn_{1-x-y}N$ ($0 \leq x \leq 1$ and $0 \leq y \leq 1$). The light emitting layer 64 includes, for example, a multiple quantum well structure (MQW) in which N periods of an AlGaN barrier layer and an InGaN well layer are alternately stacked. N is an integer of 2 or more. The thickness of each layer of the MQW structure is, for example, not less than 1 nm and not more than 10 nm.

The InGaN/GaN superlattice structure may be provided between the MQW structure and the first semiconductor layer 66. Thereby, the difference of the lattice constants between the MQW structure and the first semiconductor layer 66 is relaxed.

The first semiconductor layer 66 is provided between a first electrode 80 and the light emitting layer 64. The first electrode 80 may include titanium (Ti), an alloy of Ti and aluminum (Al), or a transparent oxide (e.g., ITO).

The first electrode 80 has, for example, a stacked structure. The first electrode 80 includes an Al layer contacting the first semiconductor layer 66, a Ni layer provided on the Al layer, and a Au layer provided on the Ni layer. The thickness of the Al layer is not less than 100 nm and not more than 200 nm. The thickness of the Au layer is not less than 1 μm.

Other configurations of the first electrode 80 may include a four-layer structure of Ti/Al/Ni/Au or a five-layer structure of Ti/Al/Ta/Pt/Au. The configuration of the first electrode 80 is selected according to the thermal processes before and after the first electrode formation process.

A dielectric layer 72 is provided between the second semiconductor layer 62 and a third intermediate layer 40. The dielectric layer 72 contacts the second semiconductor layer 62 and a protective layer 76 described below. The dielectric layer 72 also contacts the third intermediate layer 40. The dielectric layer 72 is provided around the second semiconductor layer 62 as viewed from the Z-axis direction. The dielectric layer 72 includes, for example, silicon oxide ($SiO_2$), silicon nitride (SiN), or silicon oxynitride (SiON).

The second electrode 50 is provided between the second semiconductor layer 62 and the second intermediate layer 30 described below. The second electrode 50 contacts the second semiconductor layer 62. The second electrode 50 may include, for example, one selected from Ni and Ag. The second electrode 50 may include one platinum group metal selected from Pt, Ru, Os, Rh, Ir, and Pd.

The stacked body 60 has, for example, a truncated pyramid configuration.

The protective layer 76 is provided at least on the side surface of the light emitting layer 64. For example, at least one selected from $SiO_2$, SiN, and SiON is used as the protective layer 76. Thereby, current leakage between the layers of the stacked body 60 is suppressed. The protective layer 76 covers a portion of the third surface 66a.

The first intermediate layer 20, the second intermediate layer 30, and the third intermediate layer 40 will now be described.

The stacked body 60 and the metal substrate 10 are bonded via the first intermediate layer 20, the second intermediate layer 30, and the third intermediate layer 40.

The first intermediate layer 20 is provided between the metal substrate 10 and the second semiconductor layer 62.

The first intermediate layer 20 contacts the metal substrate 10. The first intermediate layer 20 functions as a barrier layer that suppresses the diffusion of the metal. The first intermediate layer 20 is pre-provided on the first surface 10a of the metal substrate 10 in the substrate bonding. The first intermediate layer 20 suppresses the mutual diffusion of the metals between the metal substrate 10 and the second intermediate layer 30. Also, the first intermediate layer 20 strengthens the adhesion between the metal substrate 10 and the second intermediate layer 30.

The first intermediate layer 20 includes Ti. Thereby, the mutual diffusion of the metals between the metal substrate 10 and the second intermediate layer 30 is suppressed.

The thickness of the first intermediate layer 20 is not less than 50 nm and not more than 1000 nm, and more favorably not less than 50 nm and not more than 200 nm. The first surface 10a is covered with the first intermediate layer 20 by the thickness of the first intermediate layer 20 being not less than 50 nm. On the other hand, it is favorable for the thickness of the first intermediate layer 20 to be not more than 200 nm to improve the thermal conduction from the stacked body.

The first intermediate layer 20 may have a stacked structure. The details are described below.

The second intermediate layer 30 is provided between the first intermediate layer 20 and the second semiconductor layer 62. The second intermediate layer 30 bonds the stacked body 60 to the metal substrate 10.

The melting point of the material of the second intermediate layer 30 is lower than the melting point of the material of the first intermediate layer 20. The melting point of the material of the second intermediate layer 30 is lower than the melting point of the material of the third intermediate layer 40 described below. The material of the second intermediate layer 30 is, for example, low melting-point solder. The second intermediate layer 30 includes, for example, gold (Au). For example, the material of the second intermediate layer 30 may include one selected from gold-tin (AuSn) and gold-indium (AuIn). The material of the second intermediate layer 30 may be Sn.

The thickness of the second intermediate layer 30 is not less than 1000 nm and not more than 10 μm, and more favorably not less than 1 μm and not more than 5 μm.

The third intermediate layer 40 is provided between the second electrode 50 and the second intermediate layer 30. The third intermediate layer 40 includes Ti. The third intermediate layer 40 may have a stacked structure. The third intermediate layer 40 is, for example, TiW/Pt/TiW/Pt/Ti/Au. Thereby, the diffusion of the metal due to the third intermediate layer 40 is suppressed. The material of the third intermediate layer 40 may be the same as the material of the second intermediate layer 30.

The thickness of the third intermediate layer 40 is, for example, not less than 50 nm and not more than 1000 nm, and more favorably not less than 50 nm and not more than 200 nm.

A back surface electrode 90 contacts the second surface 10b of the metal substrate 10. The back surface electrode 90 may include, for example, Au.

Processing of the second surface 10b of the metal substrate 10 such as polishing, etc., is not performed. The surface roughness of the second surface 10b of the metal substrate 10 is greater than the surface roughness of the first surface 10a. The surface roughness of the second surface 10b of the metal substrate 10 is, for example, not less than 200 nm. Thereby, the back surface electrode 90 closely adheres to the metal substrate 10 due to an anchor effect.

The bonding portion of the semiconductor light emitting device 110 (portion A of FIG. 1) will now be described in detail using FIG. 2.

The first intermediate layer 20 may have a stacked structure. The first intermediate layer 20 includes a first layer 22, a second layer 24, and a third layer 26. The first layer 22 is provided between the metal substrate 10 and the second intermediate layer 30 to contact the metal substrate 10. The first layer 22 includes Ti. The first layer 22 may include Ni. The thickness of the first layer 22 is not less than 10 nm and not more than 200 nm. The thickness of the first layer 22 is, for example, 50 nm. The first layer 22 suppresses the diffusion of the metal included in the metal substrate 10 toward the second intermediate layer 30.

The second layer 24 is provided between the first layer 22 and the second intermediate layer 30. The second layer 24 includes a metal different from the material of the first layer 22. The second layer 24 includes, for example, Pt. The second layer 24 may include one selected from Ti and Au. The thickness of the second layer 24 is not less than 10 nm and not more than 200 nm. The thickness of the second layer 24 is, for example, 50 nm.

The third layer 26 is provided between the second layer 24 and the second intermediate layer 30. The third layer 26 includes Ti. Thereby, the adhesion between the second layer 24 and the second intermediate layer 30 is increased. Further, the diffusion of the metal included in the second intermediate layer 30 toward the metal substrate 10 is suppressed. The third layer 26 may include Au.

The state of the substrate bonding will now be described in comparison to a reference example.

In a semiconductor light emitting device of a first reference example, the metal substrate is a substrate of a laminated metal. The metal substrate includes, for example, a first metal layer including Cu, a second metal layer including Cu, and a third metal layer including Mo provided between the first metal layer and the second metal layer. The first intermediate layer 20 is provided between the first metal layer and the second intermediate layer. The stacked body contacts a growth substrate. The stacked body is bonded to the metal substrate via the second intermediate layer.

In the substrate bonding of the first reference example, strong stress occurs at the interface between the first metal layer and the second metal layer and the interface between the second metal layer and the third metal layer. Therefore, there is a possibility that mechanical damage such as peeling, etc., may occur at the interfaces recited above.

A semiconductor light emitting device of a second reference example differs from the semiconductor light emitting device of the first reference example in that the disposition of the metal layers is reversed. In the second reference example, the metal substrate includes, for example, a fourth metal layer including Cu, a fifth metal layer including Cu, and a sixth metal layer including Mo provided between the fourth metal layer and the fifth metal layer.

In the substrate bonding of the second reference example as well, there is a possibility that the mechanical damage such as peeling, etc., may occur at the interface between the fourth metal layer and the fifth metal layer and the interface between the fifth metal layer and the sixth metal layer. Also, there is a possibility that the mutual diffusion of the metals between the Cu of the fourth metal layer and the second intermediate layer may occur.

In a semiconductor light emitting device of a third reference example, the metal substrate is a substrate of a sintered impregnated metal. The surface roughness of the surface of the metal substrate is, for example, greater than the thickness of the first intermediate layer. The surface roughness of the surface of the metal substrate is, for example, not less than 200 nm. Otherwise, the configuration of the third reference example is similar to the configuration of the first embodiment.

Figure 4A:
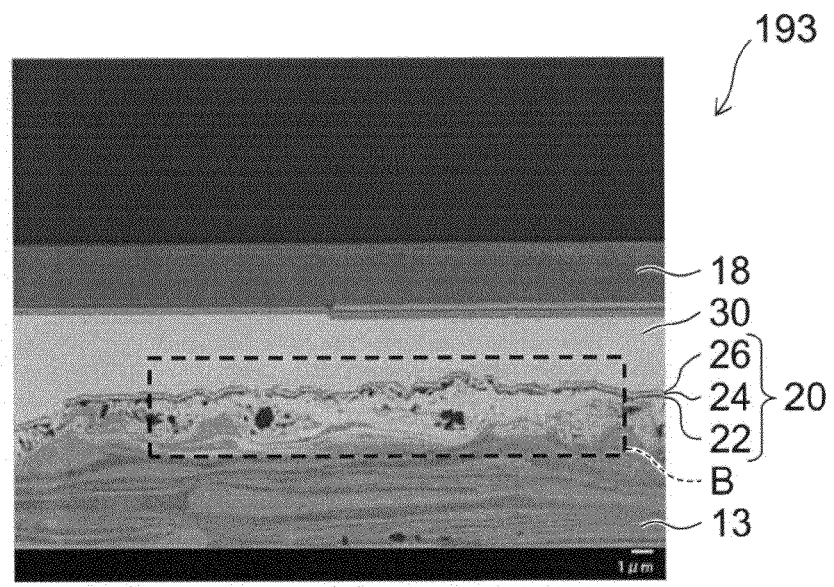
FIG. 4A and FIG. 4B are cross section SEM images of the state of the substrate bonding.
Figure 4B:
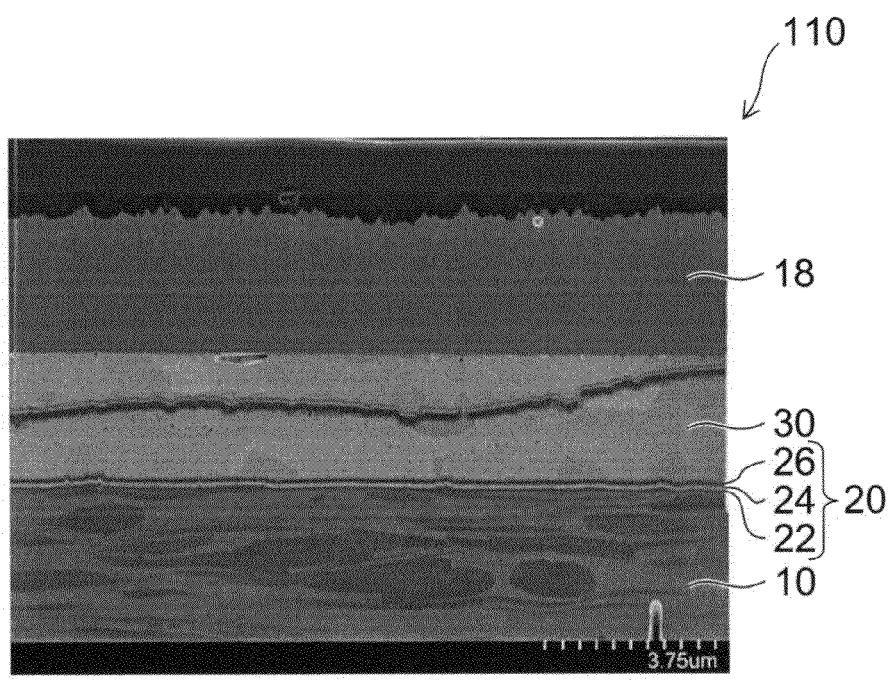

Here, FIG. 4A and FIG. 4B are cross section SEM images of the state of the substrate bonding. The first intermediate layer 20 has, for example, a three-layer structure and includes the first layer 22, the second layer 24, and the third layer 26.

FIG. 4A shows the state of the substrate bonding in the manufacturing process of the semiconductor light emitting device 193 of the third reference example.

FIG. 4B shows the state of the substrate bonding in the manufacturing process of the semiconductor light emitting device 110 of the embodiment.

The surface of a first surface 13a of the third reference example as shown in FIG. 4A is rougher than the surface of the first surface 10a of the metal substrate 10 of the first embodiment. The first intermediate layer 20 is discontinuous in portion B. Therefore, the metal (e.g., the Cu) included in the metal substrate 13 diffuses from the metal substrate 13 toward the second intermediate layer 30. EDX (Energy Dispersive X-ray spectrometry) analysis shows that Cu is detected at the second intermediate layer 30 of portion B. In the case where, for example, Au is used as the second intermediate layer 30, the composition of the AuCu occurring due to the mutual diffusion is unstable. By such mutual diffusion, peeling of the metal substrate 13 occurs easily in the semiconductor light emitting device of the third reference example.

Conversely, in the semiconductor light emitting device 110 of the first embodiment as shown in FIG. 4A, the first surface 10a of the metal substrate 10 is polished by, for example, CMP. The surface roughness of the first surface 10a of the metal substrate 10 is less than the thickness of the first intermediate layer 20. In this example, the surface roughness of the first surface 10a of the metal substrate 10 is not more than 50 nm. The surface roughness of the first surface 10a of the metal substrate 10 is 25 nm.

In the first embodiment, the first surface 10a is covered with the first intermediate layer 20 along the recesses and protrusions of the first surface 10a. Thereby, in the substrate bonding, the mutual diffusion of the metals between the metal substrate 10 and the second intermediate layer 30 is suppressed. In the semiconductor light emitting device 110, the peeling of the metal substrate 10 is suppressed. In the semiconductor light emitting device 110, the heat dissipation due to the metal substrate 10 is maintained for a long period of time. Therefore, a long life is realized for the semiconductor light emitting device 110.

Thus, according to the embodiment, various defects that may occur in the substrate bonding are suppressed.

Second Embodiment

Figure 5:
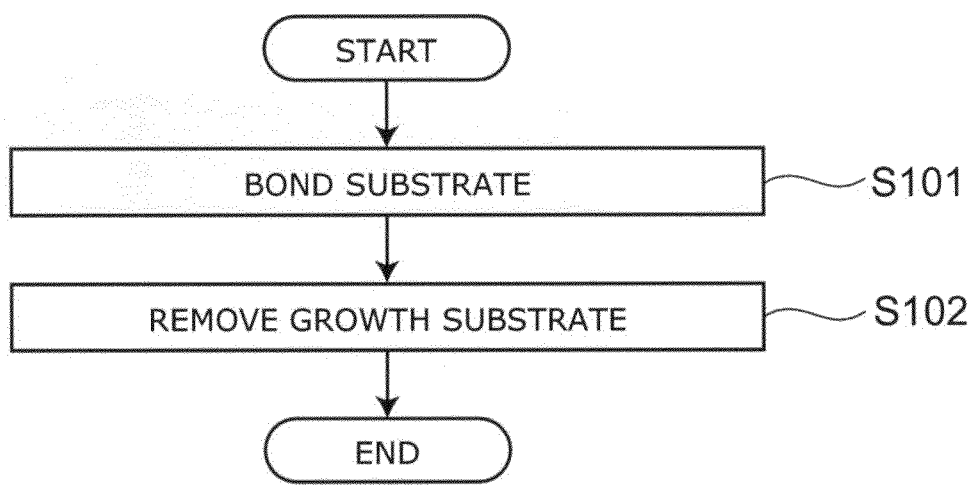
FIG. 5 is a flowchart showing a method for manufacturing a semiconductor light emitting device according to a second embodiment.

FIG. 5 is a flowchart showing a method for manufacturing a semiconductor light emitting device according to a second embodiment.

FIG. 6A to FIG. 8 are schematic cross-sectional views showing the method for manufacturing the semiconductor light emitting device.

As shown in FIG. 5, the method for manufacturing the semiconductor light emitting device according to the second embodiment includes substrate bonding (step S101) and removing the growth substrate (step S102).

In the substrate bonding (step S101), the metal substrate 10 and the stacked body 60 which is provided on the growth substrate 18 are disposed such that the second semiconductor layer 62 opposes the first intermediate layer 20 and are bonded via the second intermediate layer 30.

In the removal of the growth substrate (step S102), the growth substrate 18 is removed from the stacked body 60.

The details will now be described.

First, the substrate bonding (step S101) is performed.

Figure 6A:
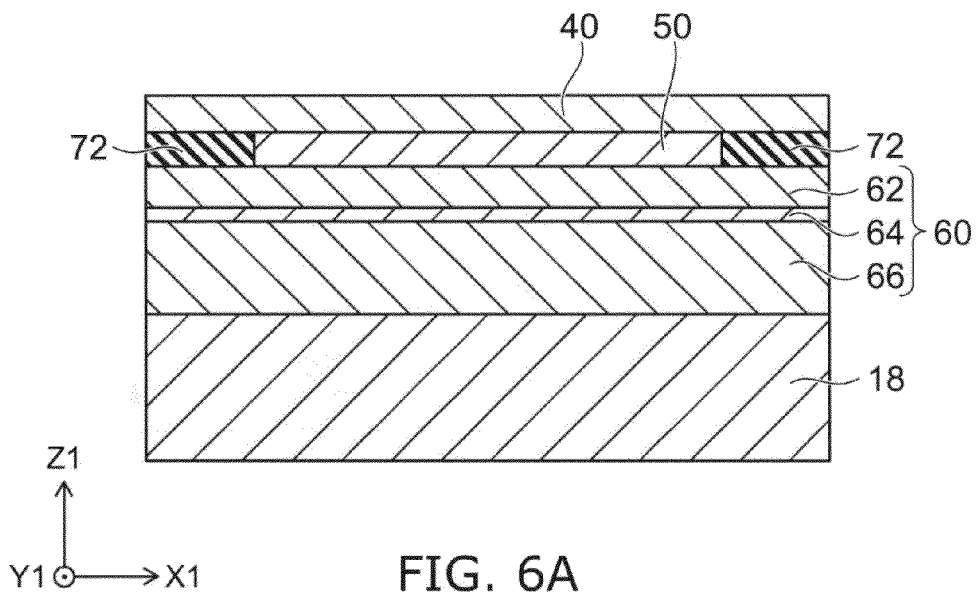
FIG. 6A to FIG. 8 are schematic cross-sectional views showing the method for manufacturing the semiconductor light emitting device.

As shown in FIG. 6A, the substrate bonding (step S101) includes, for example, a process of preparing the growth substrate 18 on which the stacked body 60 is provided. The process of preparing the growth substrate 18 includes, for example, the following processes.

In FIG. 6A, an axis perpendicular to the growth substrate 18 is taken as a Z1 axis. One axis perpendicular to the Z1 axis is taken as an X1-axis direction. A direction perpendicular to the Z1 axis and the X1 axis is taken as a Y1 axis. In this drawing, being "formed on A" means being formed on A in the Z1-axis direction. In FIG. 6A, the Z1-axis direction is a direction that is opposite to the Z-axis direction of the other drawings.

The growth substrate 18 is, for example, one selected from a Si substrate, a sapphire substrate, and a SiC substrate. The n-type first semiconductor layer 66 is formed on the growth substrate 18. The first semiconductor layer 66 may include a buffer layer. Then, the light emitting layer 64 is formed on the first semiconductor layer 66. For example, the light emitting layer 64 has the MQW structure recited above. It is favorable for the growth temperature of the light emitting layer 64 to be not less than 900° C. and not more than 950° C. The p-type second semiconductor layer 62 is formed on the light emitting layer 64.

The dielectric layer 72 is formed on the second semiconductor layer 62. A portion of the dielectric layer 72 is selectively removed. The second electrode 50 is formed on the second semiconductor layer 62 to contact the second semiconductor layer 62.

The third intermediate layer 40 is formed on the second electrode 50 and the dielectric layer 72. The third intermediate layer 40 has a stacked structure. For example, TiW/Pt/TiW/Pt is formed on the stacked body 60 by sputtering. Then, Ti/Au is formed by vacuum vapor deposition.

Figure 6B:
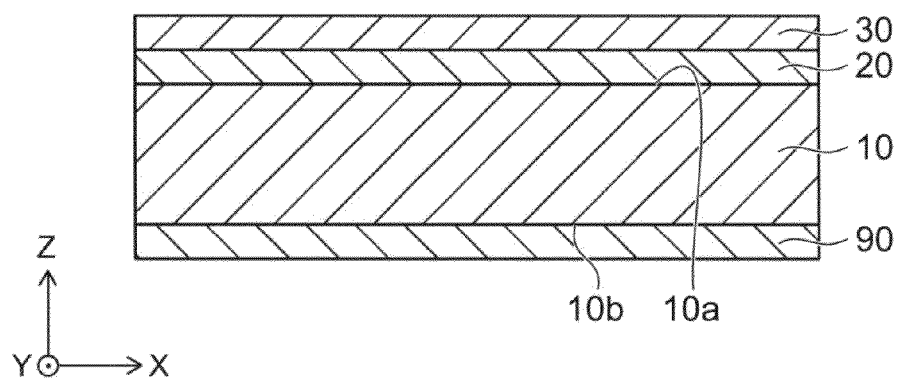

As shown in FIG. 6B, the substrate bonding (step S101) may include, for example, a process of preparing the metal substrate 10 in parallel with the process of preparing the growth substrate 18. The process of preparing the metal substrate 10 includes, for example, the following processes.

A powder of the first metal (e.g., Mo) is sintered. Thereby, the first metal portion, which is a sintered body that includes the first metal, is formed. An elution prevention agent of the second metal is coated onto the first metal portion. Then, the first metal portion is impregnated with the second metal. At this time, the elution prevention agent is removed. The coefficient of thermal expansion of the metal substrate 10 thus formed is not more than $10 \times 10^{-6}$ m/K.

Then, the first surface 10a of the metal substrate 10 is polished by CMP. The surface roughness of the first surface 10a prior to the polishing is, for example, 200 nm or more. The surface roughness of the first surface 10a after the polishing is, for example, not more than 50 nm.

Continuing, the first intermediate layer 20 is formed on the first surface 10a of the metal substrate 10. The first intermediate layer 20 has, for example, a stacked structure. For example, the first layer 22 including Ti, the second layer 24 including Pt, and the third layer 26 including Ti are formed on the first surface 10a by vacuum vapor deposition.

Then, the second intermediate layer 30 is formed on the first intermediate layer 20. The second intermediate layer 30 may include, for example, low melting-point solder. For example, one selected from AuSn, AuIn, and Sn is formed as the second intermediate layer 30 on the first intermediate layer 20 by vacuum vapor deposition. The material of the second intermediate layer 30 is selected according to the bonding method recited below.

Figure 7A:
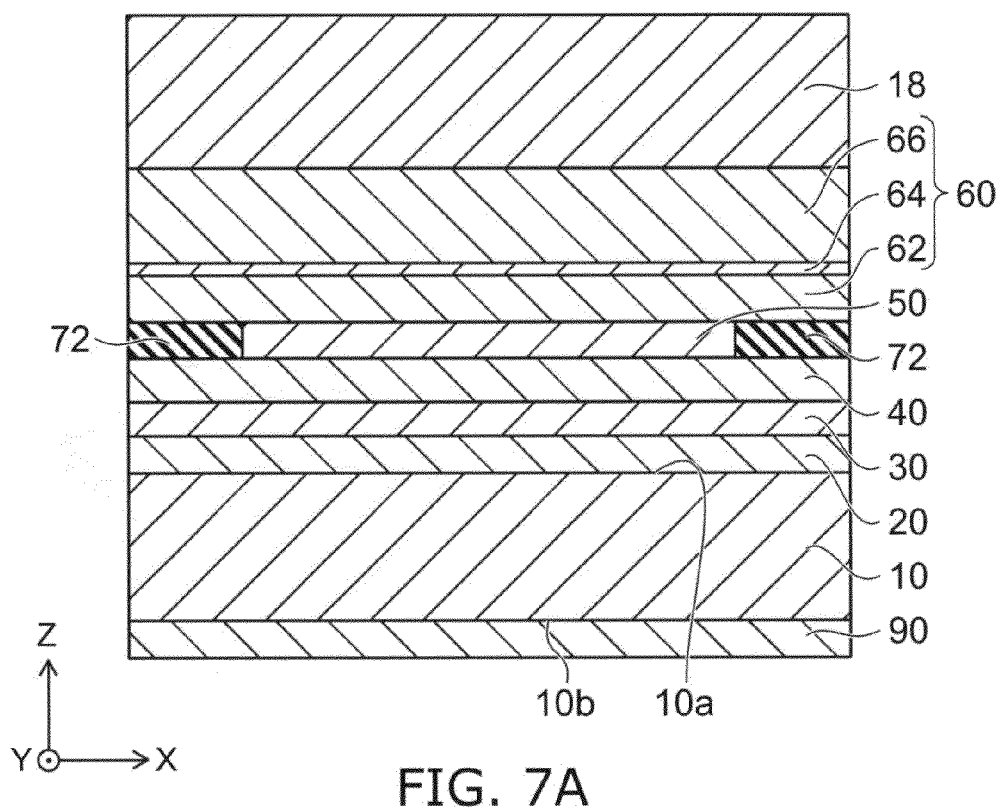

Continuing as shown in FIG. 7A, the metal substrate 10 and the stacked body 60 which is provided on the growth substrate 18 are disposed such that the second semiconductor layer 62 opposes the first intermediate layer 20. The disposition is such that the +Z direction of the metal substrate 10 opposes the +Z1 direction of the growth substrate 18. The stacked body 60 and the metal substrate 10 are bonded via the second intermediate layer 30 by heating in this state. For example, eutectic fusion or liquid phase diffusion bonding is used as the bonding method.

At this time, the surface roughness of the first surface 10a of the metal substrate 10 is less than the thickness of the first intermediate layer 20. Thereby, in the substrate bonding, the mutual diffusion of the metals between the metal substrate 10 and the second intermediate layer 30 is suppressed.

Figure 7B:
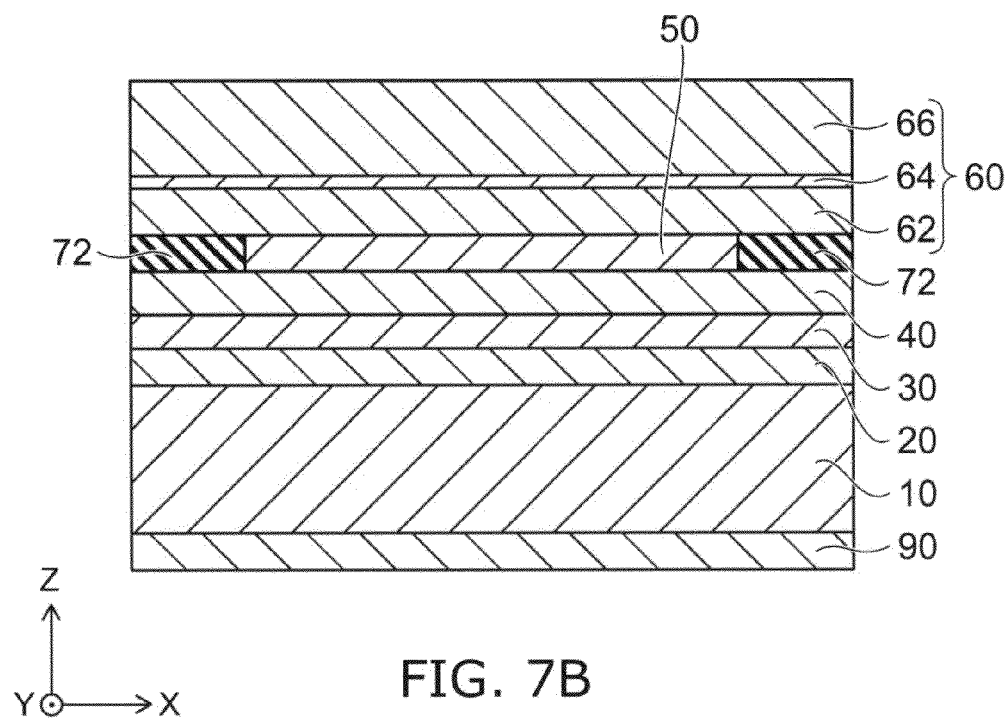

Then, as shown in FIG. 7B, the removal of the growth substrate (step S102) is performed. The growth substrate 18 is removed from the stacked body 60. Thereby, the third surface 66a of the first semiconductor layer 66 is exposed. For example, laser lift-off, substrate polishing, wet etching, or dry etching may be used to remove the growth substrate 18.

In the case where the growth substrate 18 is the sapphire substrate, for example, laser lift-off is used. The laser beam is irradiated in the direction (the −Z direction) from the growth substrate 18 toward the stacked body 60. The irradiation power density of the laser is, for example, not less than 0.65 J/cm$^2$ and not more than 0.80 J/cm$^2$. Thereby, the sapphire substrate is peeled.

Figure 8:
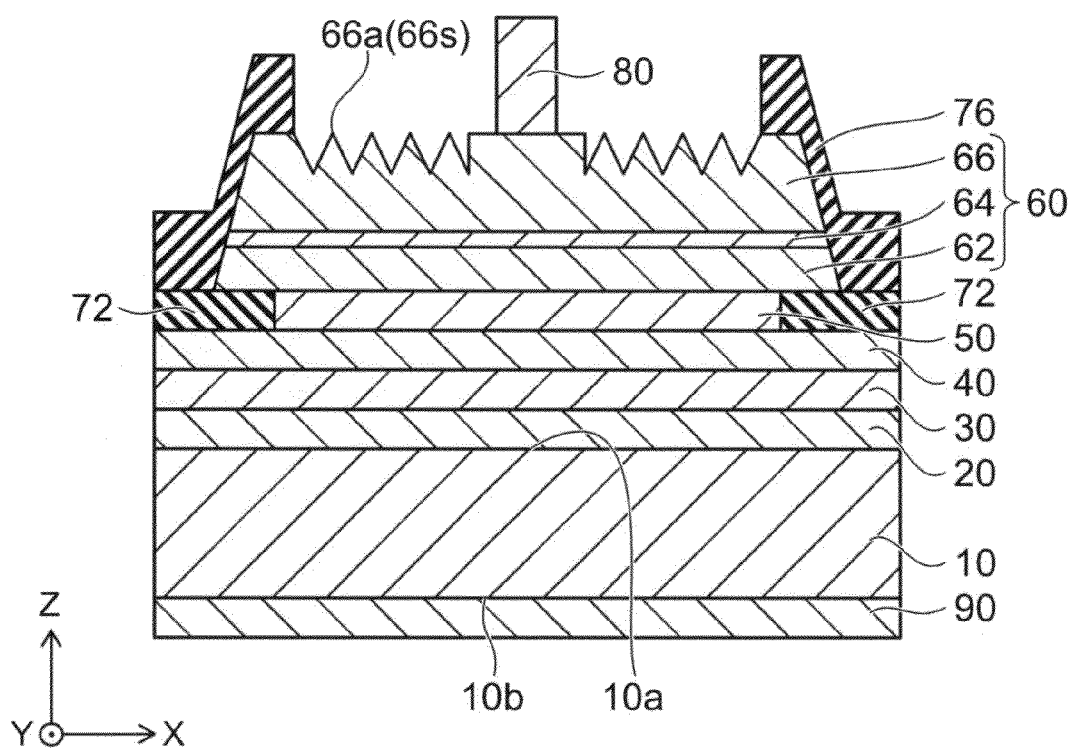

As shown in FIG. 8, the method for manufacturing the semiconductor light emitting device may include, for example, the following processes.

The stacked body 60 is selectively removed by dry etching. Thereby, the stacked body 60 is patterned into a truncated pyramid configuration.

Then, the multiple recess/protrusion portions 66s are formed in the third surface 66a of the first semiconductor layer 66. For example, anisotropic etching of the first semiconductor layer 66 is performed using a strongly alkaline aqueous solution of potassium hydroxide and/or sodium hydroxide. The etching temperature is, for example, not less than 60° C. and not more than 80° C.

Continuing, the first electrode 80 is formed on the first semiconductor layer 66 by vacuum vapor deposition, etc.

Thus, the semiconductor light emitting device 110 is formed.

Third Embodiment

Figure 9:
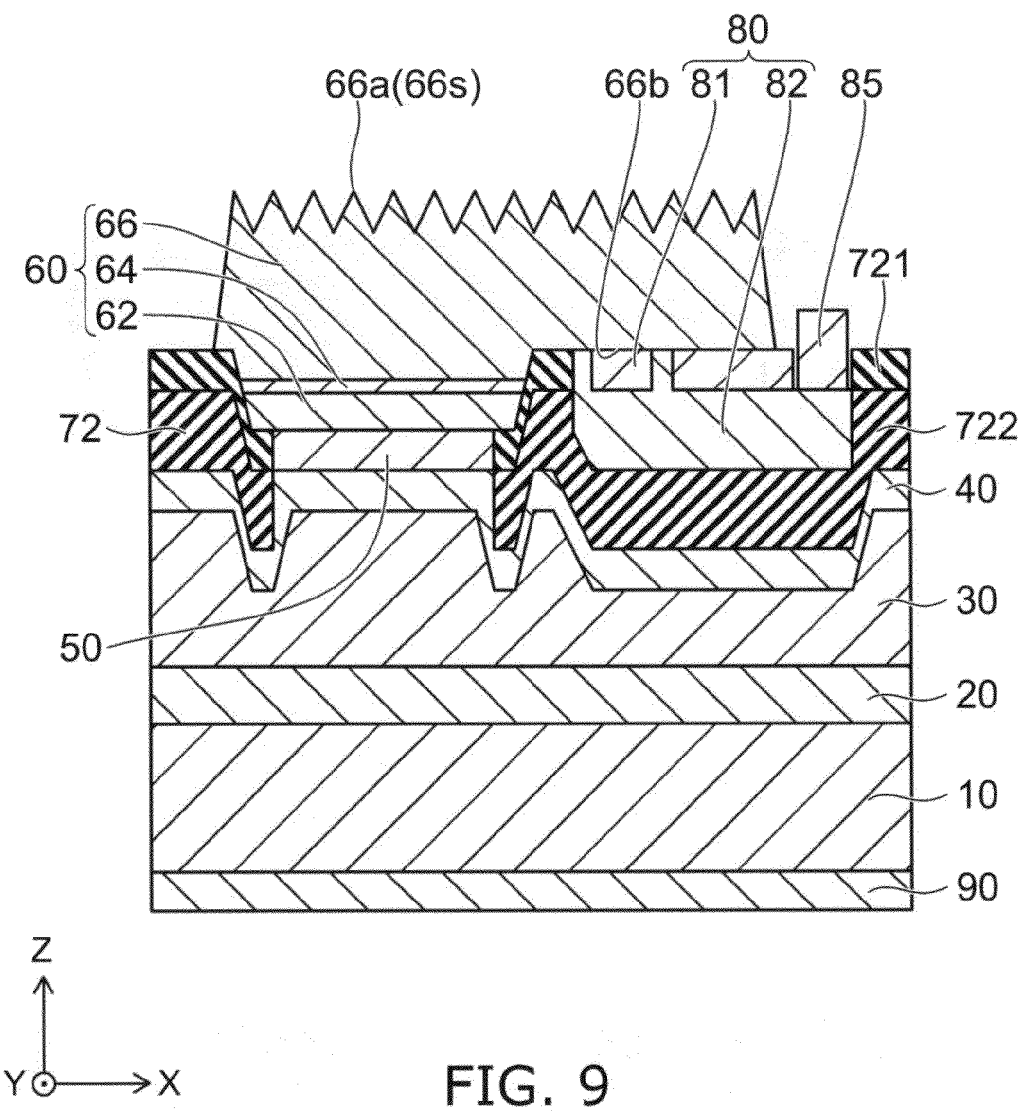
FIG. 9 is a schematic cross-sectional view showing a semiconductor light emitting device according to a third embodiment.

FIG. 9 is a schematic cross-sectional view showing a semiconductor light emitting device according to a third embodiment.

The aspects of the semiconductor light emitting device 120 according to the third embodiment that differ from those of the semiconductor light emitting device 110 according to the first embodiment will now be described.

As shown in FIG. 9, a portion of the stacked body 60 is removed, for example, by dry etching. The first semiconductor layer 66 includes the third surface 66a on the side opposite to the metal substrate 10, and a fourth surface 66b on the side opposite to the third surface 66a.

The fourth surface 66b is provided at a position where a portion of the stacked body 60 is removed.

A first dielectric layer 721 is provided in contact with the fourth surface 66b of the first semiconductor layer 66, the side surface of the light emitting layer 64, and the side surface of the second semiconductor layer 62. The first dielectric layer 721 also functions as a protective layer of the light emitting layer 64.

The first electrode 80 contacts the fourth surface 66b of the first semiconductor layer 66. The first electrode 80 includes, for example, a contact portion 81 and a draw-out portion 82. The contact portion 81 contacts the fourth surface 66b of the first semiconductor layer 66. The draw-out portion 82 contacts the contact portion 81. The first dielectric layer 721 is provided between the first semiconductor layer 66 and the draw-out portion 82. The draw-out portion 82 extends outward (e.g., in the X direction) from the stacked body 60 as viewed from the Z direction. A pad 85 is provided on a portion of the draw-out portion 82 extending outward from the stacked body 60.

A second dielectric layer 722 is provided between the first electrode 80 and the third intermediate layer 40. The first electrode 80 and the second electrode 50 are electrically insulated by the second dielectric layer 722. Thereby, electrical shorts between the first electrode 80 and the second electrode 50 in the substrate bonding are suppressed.

The second electrode 50 is provided between the third intermediate layer 40 and the second semiconductor layer 62. The second electrode 50 contacts the second semiconductor layer 62.

The second electrode 50 has an ohmic contact with the second semiconductor layer 62. The second electrode 50 includes, for example, an ohmic contact layer that includes one selected from Ag and Al, a highly reflective layer, and a cap layer that prevents migration.

In the semiconductor light emitting device 110, light is absorbed by the first electrode 80. Conversely, in the semiconductor light emitting device 120, the light is not shielded by the first electrode 80. In the semiconductor light emitting device 120, the pad 85 is disposed outward from the stacked body 60. A bonding wire connected to the pad 85 does not shield the light emitting surface (the third surface 66a). In the embodiment, the light extraction efficiency increases. In the embodiment, for example, metal-organic chemical vapor deposition (MOCVD), metal-organic vapor phase epitaxy (MOVPE), molecular beam epitaxy (MBE), and hydride vapor phase epitaxy (HVPE) may be used to grow the semiconductor layer.

For example, in the case where MOCVD or MOVPE is used, the following source materials may be used when forming the semiconductor layers. For example, TMGa (trimethylgallium) and TEGa (triethylgallium) may be used as the source material of Ga. For example, TMIn (trimethylindium), TEIn (triethylindium), etc., may be used as the source material of In. For example, TMAl (trimethylaluminum), etc., may be used as the source material of Al. For example, $NH_3$ (ammonia), MMHy (monomethylhydrazine), DMHy (dimethylhydrazine), etc., may be used as the source material of N. $SiH_4$ (monosilane), $Si_2H_6$ (disilane), etc., may be used as the source material of Si.

According to the embodiment recited above, a semiconductor light emitting device having high reliability can be provided.

In the specification, "nitride semiconductor" includes all compositions of semiconductors of the chemical formula $B_xIn_yAl_zGa_{1-x-y-z}N$ ($0 \le x \le 1$, $0 \le y \le 1$, $0 \le z \le 1$, and $x+y+z \le 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

Hereinabove, exemplary embodiments of the invention are described with reference to specific examples. However, the invention is not limited to these specific examples. One skilled in the art may similarly practice the invention by appropriately selecting specific configurations of components from known art; and such practice is included in the scope of the invention to the extent that similar effects are obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
    a metal substrate having a coefficient of thermal expansion not more than $10 \times 10^{-6}$ m/K;
        a first semiconductor layer of a first conductivity type including a nitride semiconductor;
        a second semiconductor layer of a second conductivity type provided between the metal substrate and the first semiconductor layer, the second semiconductor layer including a nitride semiconductor;
        a light emitting layer provided between the first semiconductor layer and the second semiconductor layer, the light emitting layer including a nitride semiconductor;
        a first intermediate layer provided between the metal substrate and the second semiconductor layer to contact the metal substrate; and
        a second intermediate layer provided between the first intermediate layer and the second semiconductor layer,
        a surface roughness of a first surface of the metal substrate contacting the first intermediate layer being less than a thickness of the first intermediate layer,
    wherein
    the metal substrate has a second surface on a side opposite to the first surface, and
    a surface roughness of the second surface is greater than the surface roughness of the first surface.

2. The device according to claim 1, wherein the surface roughness of the first surface is not more than 50 nanometers.

3. The device according to claim 1, wherein a thermal conductivity of the metal substrate is not less than 160 W/m·K.

4. The device according to claim 1, wherein the metal substrate includes a first metal portion including a first metal, and a second metal portion dispersed in the first metal portion, the second metal portion including a second metal.

5. The device according to claim 4, wherein
one selected from the first metal portion and the second metal portion includes Mo, and
the other selected from the first metal portion and the second metal portion includes Cu.

6. The device according to claim 1, wherein the first intermediate layer includes Ti.

7. The device according to claim 1, wherein
the first intermediate layer includes:
    a first layer provided between the metal substrate and the second semiconductor layer to contact the metal substrate, the first layer including Ti;
    a second layer provided between the first layer and the second semiconductor layer, the second layer including a metal different from the first layer; and
    a third layer provided between the second layer and the second semiconductor layer, the third layer including Ti.

8. The device according to claim 1, wherein the thickness of the first intermediate layer is not less than 50 nanometers and not more than 1000 nanometers.

9. The device according to claim 1, wherein the second intermediate layer includes Au.

10. The device according to claim 1, wherein the surface roughness of the second surface of the metal substrate is not less than 200 nanometers.

11. The device according to claim 1, further comprising a back surface electrode contacting the second surface.

12. The device according to claim 1, wherein a thickness of the metal substrate is not more than 200 micrometers.

13. The device according to claim 1, further comprising a first electrode and a second electrode,
the first electrode being in contact with the first semiconductor layer,
the second electrode being provided between the second intermediate layer and the second semiconductor layer to contact the second semiconductor layer,
the first semiconductor layer being provided between the first electrode and the light emitting layer.

14. The device according to claim 1, further comprising a first electrode and a second electrode,
the first semiconductor layer having a third surface on a side opposite to the metal substrate, and a fourth surface on a side opposite to the third surface,
the first electrode being in contact with the fourth surface,
the second electrode being provided between the second intermediate layer and the second semiconductor layer to contact the second semiconductor layer.

15. The device according to claim 14, further comprising a dielectric layer provided between the first electrode and the second intermediate layer.

16. The device according to claim 1, further comprising:
a second electrode provided between the second intermediate layer and the second semiconductor layer, the second electrode contacting a side of the second semiconductor layer opposite to the light emitting layer; and
a third intermediate layer provided between the second electrode and the second intermediate layer, the third intermediate layer including Ti.

17. The device according to claim 1, further comprising a protective layer provided at a side surface of the light emitting layer.

18. The device according to claim 17, wherein
the first semiconductor layer has a third surface on a side opposite to the metal substrate, and
the protective layer covers a portion of the third surface.

19. The device according to claim 1, wherein
the first semiconductor layer has a third surface on a side opposite to the metal substrate, and
the third surface has recess/protrusion portions provided at a spacing longer than a wavelength of light emitted from the light emitting layer.

20. A semiconductor light emitting device, comprising:
a metal substrate having a coefficient of thermal expansion not more than $10\times10^{-6}$ m/K;
a first semiconductor layer of a first conductivity type including a nitride semiconductor;
a second semiconductor layer of a second conductivity type provided between the metal substrate and the first semiconductor layer, the second semiconductor layer including a nitride semiconductor;
a light emitting layer provided between the first semiconductor layer and the second semiconductor layer, the light emitting layer including a nitride semiconductor;
a first intermediate layer provided between the metal substrate and the second semiconductor layer to contact the metal substrate; and
a second intermediate layer provided between the first intermediate layer and the second semiconductor layer,
a surface roughness of a first surface of the metal substrate contacting the first intermediate layer being less than a thickness of the first intermediate layer,
the first intermediate layer including:
a first layer provided between the metal substrate and the second semiconductor layer to contact the metal substrate, the first layer including Ti;
a second layer provided between the first layer and the second semiconductor layer, the second layer including a metal different from the first layer; and
a third layer provided between the second layer and the second semiconductor layer, the third layer including Ti.

* * * * *